ELECTRONIC SOLID STATE LOCK MECHANISM

Filed June 28, 1965 2 Sheets-Sheet 1

Marvin S. Rose INVENTOR.

BY Clarence A. O'Brien and Harvey B. Jacobson Attorneys

ELECTRONIC SOLID STATE LOCK MECHANISM

Filed June 28, 1965

Marvin S. Rose
INVENTOR.
BY Clarence A. O'Brien
and Harvey B. Jacobson
Attorneys United States Patent Office 3,347,072

Patented Oct. 17, 1967

3,347,072

ELECTRONIC SOLID STATE LOCK MECHANISM

Marvin S. Rose, % H. Bretan, 16 SW. 1st Ave., Miami, Fla. 33130

Filed June 28, 1965, Ser. No. 467,253
16 Claims. (Cl. 70—277)

ABSTRACT OF THE DISCLOSURE

Battery cells mounted in a key to power a latch-releasing solenoid when the key is inserted into a lock mechanism. A combination of detuned tank circuits are associated with crystal-controlled oscillators in the lock mechanism housing so that the proper arrangement of inductive tuning cores in the key will tune the tank circuits and operate the oscillators. Operation of all the oscillators produces an output exceeding the threshold of a gate to trigger operation of the latch-releasing solenoid.

This invention relates to a key controlled lock device and more particularly to an electronically operated locking system.

A primary object of the present invention is to provide a solid state electronic locking mechanism for replacement of mechanically operated locking mechanisms or the like.

Another object of the present invention is to provide an electronic locking mechanism having a plurality of fixed frequency oscillators with the same operating frequency but differently detuned so that insertion of a proper key may simultaneously tune and operate all of the oscillators without dependence upon physical contact between the oscillator circuit and operation controlling tuning cores mounted in the key.

A still further object of the present invention is to provide a novel key member through which a lock device may be electronically released, the key member containing the source of electrical energy through which the electronic circuit mounted within the lock device housing into which the key is inserted, may be operative to perform its function.

An additional object in accordance with the foregoing objects, is to provide a plurality of oscillators, the amplified outputs of which are coupled to a gating circuit so that when all of the oscillators are simultaneously rendered operative by means of a proper key member, the amplitude level of the combined amplified output of the oscillators will overcome a threshold bias also established when the key member is inserted. When the threshold bias is overcome, an energizing current is developed in the gate circuit for operating a release mechanism with which the system is associated, the establishment of the threshold bias operating as a safety measure to prevent release of the lock mechanism by insertion or positioning of an improperly coded operating member.

Yet another object of the present invention is to provide an electronically operated, key-controlled locking mechanism which is relatively small and easy to install taking advantage of the latest techniques in the formation and mounting of the circuitry within a fixed lock housing receiving the key member.

These together with other objects and advantages which will become subsequently apparent reside in the details of construction and operation and more fully hereinafter described and claimed, reference being had to the accompanying drawings forming a part hereof, wherein like numerals refer to like parts throughout, and in which:

Figure 4:
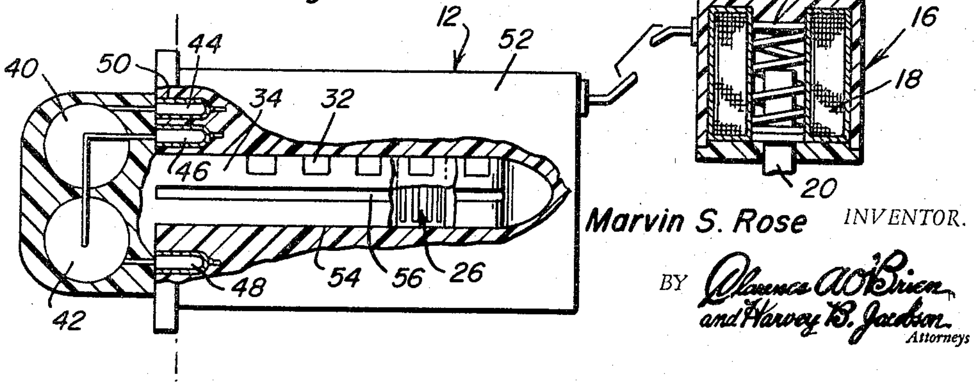
FIGURE 4 is a side elevational view of the lock mechanism and key member inserted therein with parts broken away and shown in section.

Referring initially to FIGURES 1 through 5, it will be noted that the system of the present invention generally denoted by reference numeral 10 includes a fixedly mounted lock controlling device generally referred to by reference numeral 12 adapted to receive therewithin a key member 14. The lock controlling device 12 may be fixedly mounted in any suitable location such as now occupied by tumbler type locking devices for doors or the like. Also associated with the lock controlling device 12 and electrically connected thereto is a latch release mechanism 16 as shown in FIGURE 4 to which energizing current is supplied so as to cause its solenoid coil 18 to retract a latch element 20, against the bias of the spring 22. In use, the latch element 20 is projected to the position illustrated in FIGURE 4 so as to block movement of a latch bolt by a person for example attempting to manually turn the door knob for retracting the latch bolt. When a proper key member 14 is inserted into the lock control device 12, however, energizing current will be operative to retract the latch element 20, this energizing current being established in response to a signal produced by insertion of the correct key member into the lock controlling device.

Figures 6, 7:
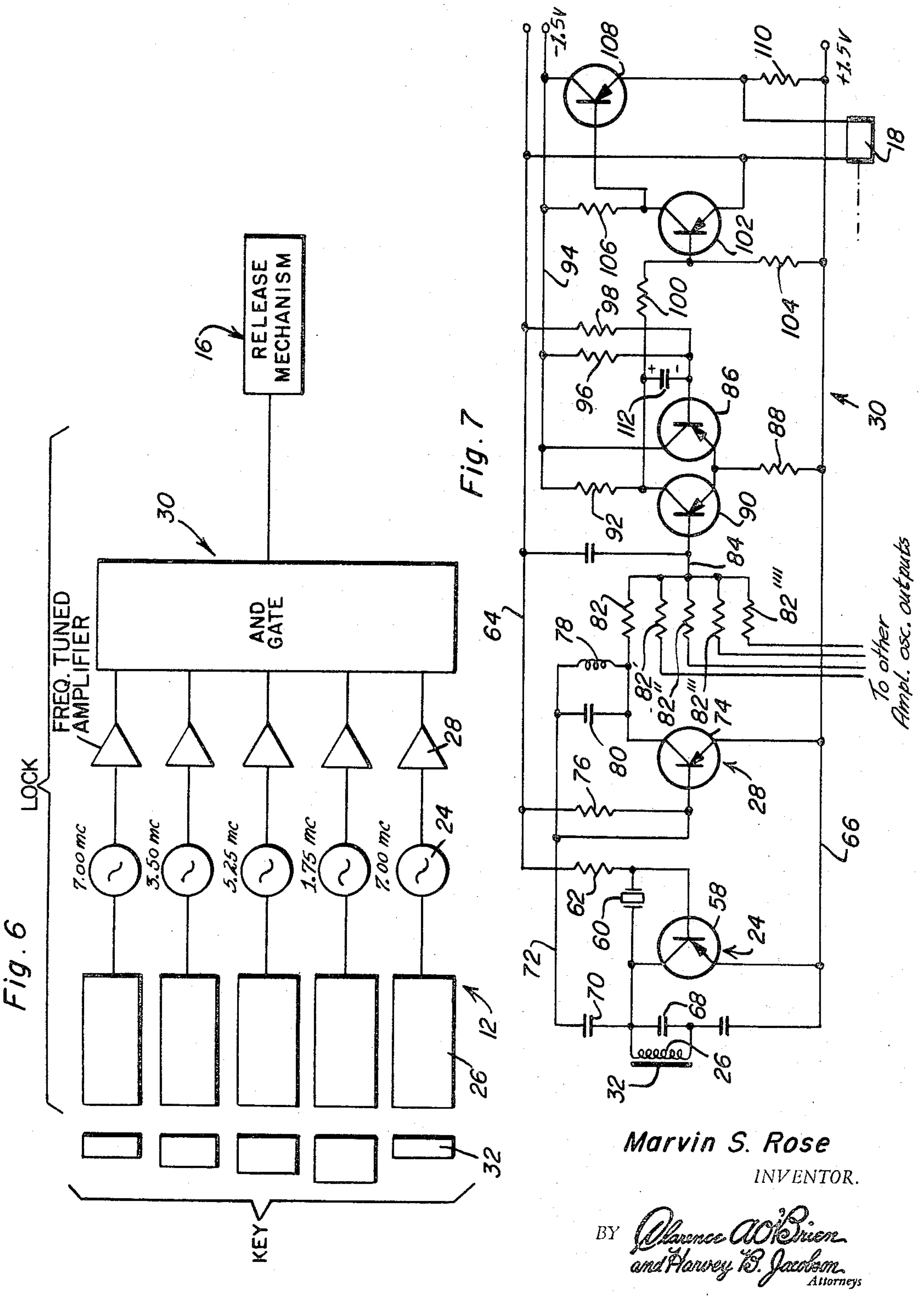
FIGURE 6 is a block diagram illustrating the system of the present invention.
FIGURE 7 is an electrical circuit diagram corresponding to the system of the present invention.

Referring now to FIGURE 6, the operating principle of the locking mechanism of the present invention may be readily explained. Mounted within the lock controlling device 12, are a plurality of electronic oscillators 24 each of which includes a tuning circuit element 26 operative to detune the oscillator from a fixed operating frequency associated with each of the oscillators. Accordingly, when each of the oscillators is rendered operative it will supply an output signal at a common frequency such as 7 megacycles to an associated frequency tuned amplifier 28 operative to amplify only signals at the operating frequency of the oscillator, and rejecting all other multiples of the oscillator operating frequency. When all of the oscillators are simultaneously rendered operative at the operating frequency, a threshold bias established within the gate circuit 30 is overcome so as to develop an energizing current supplied to the release mechanism 16. All of the oscillators are therefore rendered operative upon insertion of the proper key member having a plurality of different sized tuning elements 32. When the key member is inserted, the respective tuning elements 32 are positioned in operative relationship to the tuning circuit elements 26 aforementioned through which the oscillators are detuned by different amounts. If the key member has the proper arrangement of such tuning elements 32, all of the oscillators are returned to the operating frequency so as to effect operation of the release mechanism 16.

Figures 1, 2:
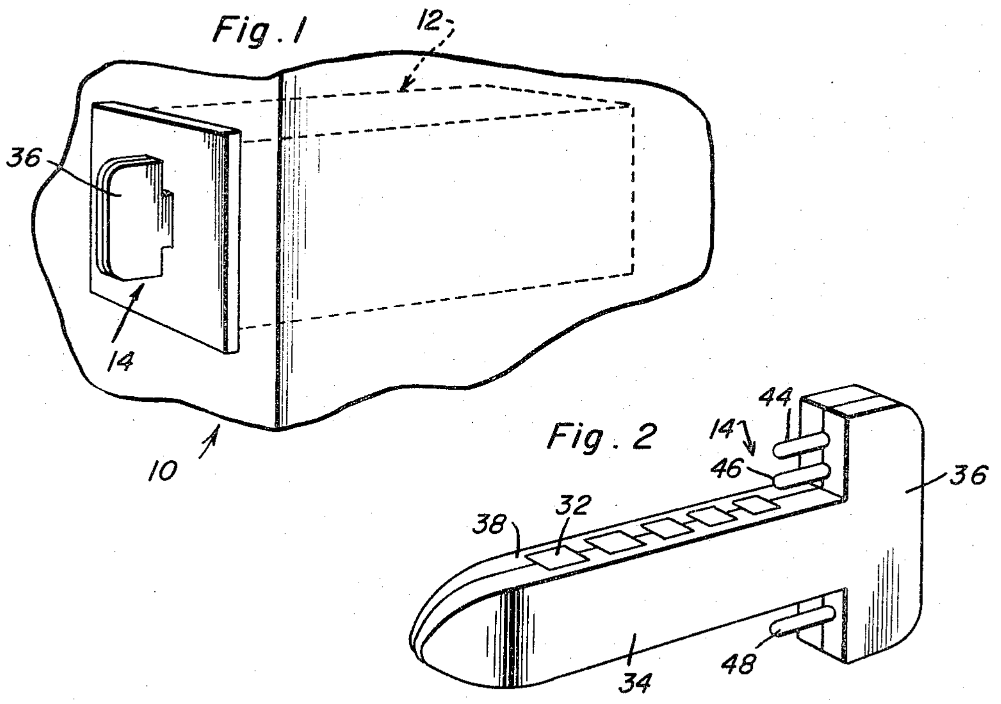
FIGURE 1 is a perspective view showing a typical key operated lock installation in accordance with the present invention.
FIGURE 2 is a perspective view of the key member associated with the system of the present invention.
Figure 3:
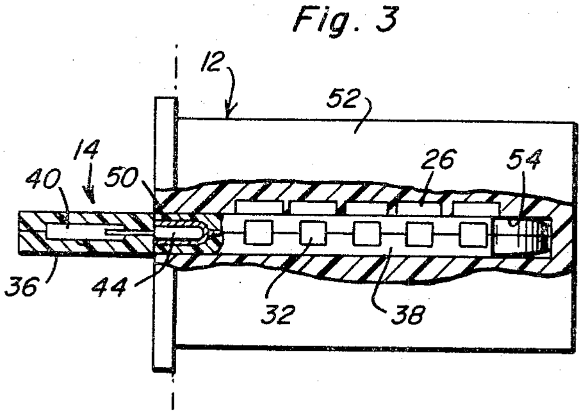
FIGURE 3 is a top plan view with parts broken away and shown in section of the lock mechanism with the key member inserted therein.
Figure 5:
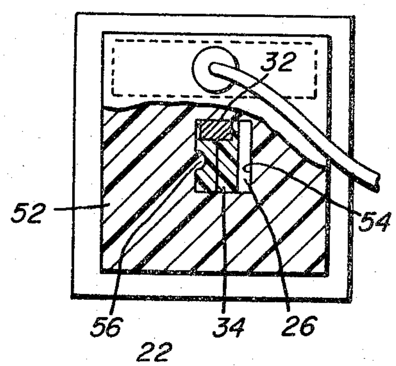
FIGURE 5 is a rear elevational view of the lock mechanism with parts broken away and shown in section.

Referring once again to FIGURES 2–5, it will be observed that the key member 14 includes two longitudinally split sections preferably made of a non-conductive transparent material such as a thermal setting plastic that is crackproof and acid-proof. The key member will include an elongated insertion portion 34 of a length comparable to that of any five pin key member associated with tumbler lock devices. Connected to the end of the insertion portion 34 is an enlarged knob portion 36 which extends laterally beyond the longitudinal edges of the insertion portion 34. Embedded within the insertion portion for exposure along the control edge 38 thereof are the tuning elements 32 aforementioned which may be in the form of different sized ferrite cores. The source of electrical energy for operating the lock mechanism is also mounted by the key member and housed within the knob portion 36 thereof. As more clearly seen in FIGURES 3 and 4, the source of electrical energy includes a pair of nickel-cadmium cells 40 and 42 interconnected in series. The interconnected cells are connected by conductors also embedded within the knob portion 36 to a plurality of prong connectors 44, 46 and 48. The connector prong 44 therefore forms a negative voltage terminal for the cells while the connector prong 48 forms the positive voltage terminal. The intermediate prong 46 forms a reference or ground terminal. The connector prongs extend from the knob portion 36 in parallel spaced relation to the insertion portion 34 so that they may be received within sockets 50 mounted in the housing 52 associated with the lock control device 12. Accordingly, a slot 54 is formed in the housing 52 for receiving the key and may be provided with a longitudinal projection 56 adapted to be guidingly received in the longitudinal slot or depression 56 formed on one side of the insertion portion 34 of the key member as shown in FIGURES 4 and 5. A key member having the proper arrangement of ferrite cores 32 will therefore be operative to activate the lock control device 12 when the key member is fully inserted into the housing 52. So that the arrangement of ferrite cores 32 may be duplicated, each core is tinted with a different code color visible through the transparent material of the key member within which they are embedded.

When the key member is fully inserted within the housing, each of the tuning cores 32 will be operatively aligned with one of the aforementioned tuning circuit elements 26 fixedly mounted within the housing 52. Each of the tuning circuit elements may be in the form of an inductance coil that could be printed on a non-conductive base shaped to be complementary to the cross-section of the key member. The inductance values of these coils are arranged so that a corresponding core 32 will produce resonance at the oscillator frequency. Accordingly, each of the tuning circuit coils is connected to one of the oscillators, there being five such oscillator components associated with the lock mechanism of the illustrated embodiment.

Referring now to FIGURE 7, it will be observed that each of the oscillator components 24 includes a closed oscillator circuit having a PNP transistor 58 and a crystal element 60 in the base-emitter circuit thereof so as to control oscillation of the oscillator circuit at a fixed operating frequency such as the seven megacycle frequency aforementioned. The base of the transistor 58 is maintained at a predetermined bias above a reference potential by the bias resistor 62 connecting the base to the reference potential line 64 to which the connector prong 46 is electrically connected as aforementioned. The emitter of the transistor 58 is connected to the positive potential line 66 to which the positive terminal of the series connected cells 40 and 42 are connected by the connector prong 48. The collector of the transistor 58 is also connected to a tank circuit including the tuning coil 26 and parallel connected capacitor 68 arranged to produce resonance when the proper tuning core element 32 is brought into proximity of the coil 26. When this occurs, an oscillating output at the operating frequency aforementioned is obtained from the collector of the transistor and supplied through the coupling capacitor 70 to the output line 72. It will be appreciated that the inductances of the coil elements 26 associated with each of the oscillator circuits and the associated tuning cores 32 may provide a wide range of lock combinations capable of causing all of the oscillators to operate at the same operating frequency. Accordingly, a high security lock system may be provided as well as a convenient master keying method.

Associated with each of the oscillator circuits, is the radio frequency tuned amplifier 28 which includes a PNP transistor 74 as shown in FIGURE 7. The amplifier 28 is arranged to amplify only an output signal supplied thereto by the output line 72 at the operating oscillator frequency as aforementioned. Accordingly, the output signal from the oscillator is fed to the base of the transistor 74 connected to the negative voltage line 64 through the bias resistor 76 while the frequency to which the amplifier is tuned is controlled by the parallel connected inductance 78 and capacitor 80 connected in the collector-base circuit of the transistor. The amplified oscillator output from the collector of the transistor 74 is fed through a coupling resistor 82 to the input line 84 of the gate circuit 30. It will be observed that the input line 84 is also connected through coupling resistors 82′, 82″, 82‴, and 82⁗ to the other four oscillator circuits associated with the lock control device.

The gate circuit 30 includes transistors 86 and 90 the emitters of which are connected through the resistor 88 to the positive voltage line 66. The establishment of a current path through the transistor 90 connected in series with the load resistor 92 in parallel relation to the transistor 86 to the negative voltage line 94 will depend upon the forward bias on the transistor 86. The base of the transistor 86 is therefore supplied with a forward bias of a value which will determine a base threshold voltage necessary to render transistor 90 conductive. When the threshold voltage is exceeded, the transistor 90 conducts so as to supply a signal voltage from its collector through the coupling resistor 100 to the base of transistor 102. Accordingly, no current path will be established through the transistor 90 until the bias applied to the base thereof exceeds a corresponding forward threshold bias established on the base of the transistor 86. This threshold bias is determined by the value of the resistor 98 which controls the level of the bias voltage on the base of transistor 86 above the reference potential line 64. When the combined amplified outputs from the oscillators are supplied to the input line 84 connected to the base of the transistor 90, this threshold bias is overcome so as to render the transistor 90 conductive. A cut-off voltage held on the base of the transistor 102 by the capacitor 112, is thereby removed to render transistor 102 conductive. The forward bias held on the base of transistor 108 is then also removed causing it to switch to a nonconductive state.

The transistor 102 is forwardly biased to a conductive state through the voltage dividing network including resistors 100 and 104 connected to the base thereof. However, when the transistor 90 is nonconductive, the negative voltage supplied through bias resistor 96 to the base of transistor 86 charges the capacitor 112 so that the charge stored therein will hold a cut-off voltage on the base of transistor 102 to which the capacitor is connected in series with resistor 100. As long as the transistor 102 is held nonconductive, a forward bias is applied to the base of transistor 108 through resistor 106 so as to conduct current across the voltage lines 66 and 94 through the resistor 110 which is in series with the coil 18. Therefore, when the forward bias of the transistor 108 is removed energizing current must flow through the coil 18 since the current path through transistor 108 is interrupted, in order to operate the release mechanism 16.

From the foregoing description the construction, installation and operation of the lock mechanism of the present invention will be apparent. It will therefore be recalled that the lock mechanism fixedly mounts within a housing a plurality of oscillators 24 the circuits of which are closed. However, the oscillators include tank circuits having inductance coils 26 of different inductance values for detuning the oscillators by different amounts from a common operating frequency. Thus, when the key member 14 is inserted into the housing 52 with the proper coded arrangement of tuning cores 32, each of the tank circuits of the oscillators will be tuned to resonance in order to simultaneously cause oscillation of the oscillators at the same operating frequency. The energy for operating the oscillators as well as the other components of the lock control device 12 is supplied from the key member itself which houses a pair of battery cells 40 and 42 for this purpose. While energy is supplied through the prongs 44 and 48 for operation of the lock mechanism, control over the solid state oscillators is exercised by the key mounted tuning cores 32 without any physical or electrical contact. Frequency tuned amplifiers 28 amplify the outputs of the oscillators which combine to supply a signal to the gate circuit 30 having a voltage level exceeding a threshold bias established in the gate circuit so as to prevent development of an energizing current in the solenoid coil 18 of the release mechanism 16. Thus key operating members which do not have the correct coded arrangement of tuning cores will not be effective to produce the energizing current necessary to operate the release mechanism. In view of use of solid state circuitry, the lock mechanism may be made relatively small and lightweight and may also be protectively sealed within the housing 52. The lock mechanism will therefore be useful as a replacement for mechanical types of lock mechanism without any of the disadvantages associated therewith such as frictional contact wear, lubrication problems and corrosion of materials. Further, a wide range of lock combinations and a higher security lock system will be provided by the arrangement of the present invention which could also be adaptable to rotatable types of combination locks.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention as claimed.

What is claimed as new is as follows:

1. A key operated lock combination comprising a fixedly mounted housing having a slot within which a key member is received, a plurality of oscillator components mounted within the housing from which outputs at a fixed operating frequency are obtained, each of said oscillator components having a closed tuning circuit mounted within the housing, tuning means mounted by the key member in operative spaced proximity to each of the tuning circuits for rendering the oscillator components operative at said fixed frequency, gate means mounted in the housing and having a threshold level, a lock release mechanism connected to said gate means, frequency tuned amplifier means operatively connecting the oscillator components to the gate means for supply of amplified oscillator outputs thereto, and means connected to the gate means for operating said lock release mechanism when the threshold level thereof is exceeded by the combined amplified outputs of all the oscillator components at said fixed frequency.

2. The combination of claim 1 wherein each of said oscillator components comprises a crystal controlled oscillator circuit having a tank circuit section including said tuning circuit element, the tank circuit sections of said oscillator components being detuned from said fixed frequency by different amounts.

3. The combination of claim 2 wherein said tuning means comprises a plurality of tuning cores of different sizes mounted in fixed spaced relation to each other in said key member, said cores being positioned by the key member in operative relationship to the respective tuning circuit elements for returning the oscillator components to said fixed frequency.

4. The combination of claim 3 including a source of electrical energy mounted within the key member, and connector means connecting said source to the gate means for establishing said threshold level and energizing the release mechanism in response to insertion of the key member in the slot of the housing.

5. The combination of claim 1 wherein said tuning means comprises a plurality of tuning cores of different sizes mounted in fixed spaced relation to each other in said key member, said cores being positioned by the key member in operative relationship to the respective tuning circuit elements for returning the oscillator components to said fixed frequency.

6. The combination of claim 1 including a source of electrical energy mounted within the key member, and connector means connecting said source to the gate means for establishing said threshold level and energizing the release mechanism in response to insertion of the key member in the slot of the housing.

7. In a key operated device, a housing, a plurality of oscillators mounted in the housing, means connected to said oscillators for detuning thereof by different amounts from a common frequency, a key member insertable into the housing, a source of electrical energy mounted in said key member, connector means mounted on the key member for supplying electrical energy to the oscillators in response to insertion of the key member in the housing, a plurality of different tuning elements adapted to be mounted in a predetermined orientation within the key member for tuning said oscillators to the common frequency when the key member is inserted into the housing, a gate circuit connected to the oscillators for developing an energizing current when all of the oscillators are simultaneously rendered operative at said common frequency, and a current operated mechanism connected to said gate circuit for receiving said energizing current therefrom, said gate circuit including means energized by said source of energy for establishing a threshold bias preventing development of said energizing current, and means coupling the oscillators to the gate circuit for supply of a combined signal voltage overcoming the threshold bias when all of the oscillators are rendered operative by insertion of a proper key member into the housing, said key member including an elongated insertion portion and an enlarged knob portion extending laterally of the insertion portion, said tuning elements being embedded within the insertion portion along one longitudinal edge thereof, said source of electrical energy being housed within the knob portion and said connector means including prongs projecting from the knob portion in parallel spaced relation to the insertion portion and electrically connected to the source.

8. In an electronically operated lock system, a key member comprising an elongated insertion portion having a control edge, a knob portion connected to the insertion portion and extending laterally thereof, a plurality of inductive tuning elements embedded in spaced relation within said insertion portion and exposed along said control edge, at least one battery mounted within the knob portion and at least one connector prong connected to the battery and projecting from the knob portion in spaced relation to the insertion portion.

9. The combination of claim 8 wherein said insertion portion is made of a nonconductive, transparent material, and said tuning elements comprise code-colored ferrite cores.

10. In a key operated device, a housing, an oscillator mounted in the housing, current operated mechanism energized in response to operation of said oscillator, a key member insertable into the housing having an elongated insertion portion and an enlarged knob portion, a tuning element embedded within the insertion portion, a source of electrical energy housed within the knob portion, and connector prong means projecting from the knob portion into the housing in spaced relation to the insertion portion electrically connecting the source of electrical energy to the oscillator for operation thereof when the tuning element is in operative proximity thereto.

11. In combination, a locking apparatus and a removable key assembly embodying a source of electrical energy and at least two control components of specific values, said locking apparatus including: at least two closed electronic oscillator circuits detuned from an operating frequency, means mounting the oscillator circuits in operative relation to the control components of the key assembly for retuning the closed oscillator circuits to the operating frequency thereof, signal level sensing means responsive only to simultaneous signals from each of the oscillator circuits at the operating frequency for producing an output, and latch releasing means energized by said source of electrical energy in response to said output from the signal level sensing means.

12. The combination of claim 11 wherein said signal level sensing means includes frequency tuned amplifier means connected to the oscillator circuits for amplifying output signals only at said operating frequency, and an electronic gate component connected to the amplifier means having a threshold value exceeded only by amplified signals simultaneously received to operate the latch releasing means.

13. The combination of claim 12 wherein said control components embodied in the key assembly include core elements inductively coupled to the oscillator circuits.

14. The combination of claim 11 wherein said control components embodied in the key assembly include core elements inductively coupled to the oscillator circuits.

15. An electronic lock combination including a plurality of oscillator components operative at a predetermined frequency, each of the oscillator components including a closed tuning circuit having a resonant frequency different from an operating value of the associated oscillator component, a removable key assembly embodying tuning elements inductively coupled to the tuning circuits for changing the resonant frequency thereof to said operating value, a lock releasing device, and signal level discriminating means connecting the oscillator components to the lock releasing device for operation thereof in response to signals at said predetermined frequency from all of the oscillator components.

16. The combination of claim 15 including a replaceable source of electrical energy mounted within the key assembly, and connector means for supplying current from said source to the oscillator components and the lock releasing device only when the tuning elements are inductively coupled to the tuning circuits.

References Cited

UNITED STATES PATENTS

| | | | |
|---|---|---|---|
| 3,093,994 | 6/1963 | Richard | 70—277 X |
| 3,134,254 | 5/1964 | Richard | 70—277 |
| 3,225,576 | 12/1965 | Richard | 70—277 X |

BOBBY R. GAY, *Primary Examiner.*